United States Patent [19]

Avanic et al.

[11] Patent Number: 5,166,857
[45] Date of Patent: Nov. 24, 1992

[54] ELECTRONICALLY TUNABLE CAPACITOR SWITCH

[75] Inventors: Branko Avanic, Miami; Robert L. Benenati, Tamarac; Robert E. Stengel, Ft. Lauderdale, all of Fla.; Robert G. Kinsman, Naperville, Ill.

[73] Assignee: Motorola Inc., Schaumburg, Ill.

[21] Appl. No.: 812,927

[22] Filed: Dec. 24, 1991

[51] Int. Cl.[5] .......................... H01G 7/00; H01P 4/10
[52] U.S. Cl. ..................................... 361/280; 455/78
[58] Field of Search .................... 331/108; 455/83, 78; 361/313, 280

[56] References Cited

U.S. PATENT DOCUMENTS

| | | |
|---|---|---|
| 4,973,922 | 11/1990 | Embree et al. ............... 331/108 D |
| 4,982,442 | 1/1991 | Sarokhanian .................. 455/83 |
| 5,060,293 | 10/1991 | Kok et al. ..................... 455/78 |

Primary Examiner—Donald A. Griffin
Attorney, Agent, or Firm—M. Mansour Ghomeshi

[57] ABSTRACT

An integrated switch (100) includes a first input port (102), a second input port (112) and an output port (106). The integrated switch (100) comprises a first electronically-tunable integrated capacitor (104) having a control line (108) for selectively coupling the first input port (102) to the output port (106). The switch (100) also includes a second electronically-tunable integrated capacitor (110) having a control line (108) for selectively coupling the second input port (112) to the output port (106).

22 Claims, 4 Drawing Sheets

ELECTRONICALLY TUNABLE CAPACITOR SWITCH

TECHNICAL FIELD

This invention relates generally to switches and more specifically to antenna switches.

BACKGROUND

Antenna switches are used in communication devices where switching between a receive and a transmit mode is required. In general, switching is accomplished via pin diodes. A pin diode is a specialized microwave diode which has an ON mode, when the diode is forward biased, and an OFF mode, when the diode is reverse biased. In the OFF mode the diode exhibits a high impedance, while in the ON mode it exhibits a low resistive impedance, where the resistance is proportional to the current through the device.

In the ON state, the diode draws a considerable amount of current. In systems with low power requirements, or in portable devices where power is of premium value, this high ON current can become a significant burden, the elimination of which is highly desirable. As an alternative, designers have turned their attention to GaAs switches in order to combat the high current consumption of pin diodes. These switches are, however, expensive and do not provide sufficient benefits to antenna switches to justify their high costs.

Another problem with pin diodes is the non-linear behavior of their p-n junction which is a significant problem under large signal conditions. A trend toward integration of communication devices has placed a significant demand for antenna switches to be integrated. Pin diodes can't be integrated and have, therefore, prevented the total integration of antenna switches. The non-linearity of pin diodes along with their lack of integratability added to their high current consumption has created a need for a low cost antenna switch which overcomes the deficiencies of the prior art.

SUMMARY OF THE INVENTION

Briefly, according to the invention, an integrated electronic switch having first and second input ports and an output port is disclosed. The integrated electronic switch comprises a first electronically-tunable integrated capacitor having a first control means for selectively coupling the first input port to the output port. The integrated electronic switch also includes a second electronically-tunable integrated capacitor having a second control means for selectively coupling the second input port to the output port.

DETAILED DESCRIPTION OF THE PREFERRED EMBODIMENT

Figure 1:
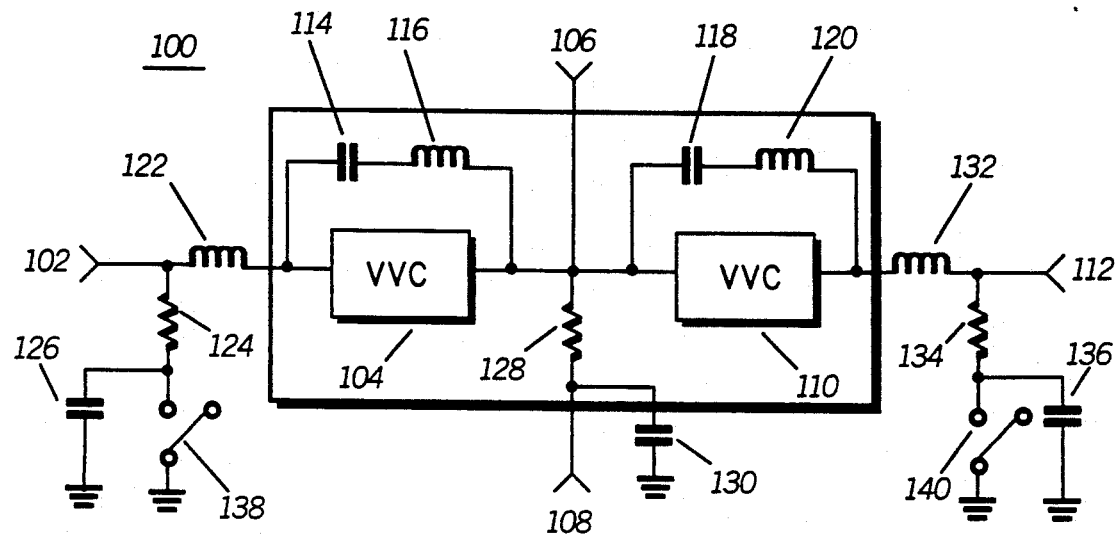
FIG. 1 is an AC switching network in accordance with the present invention.
Figure 3:
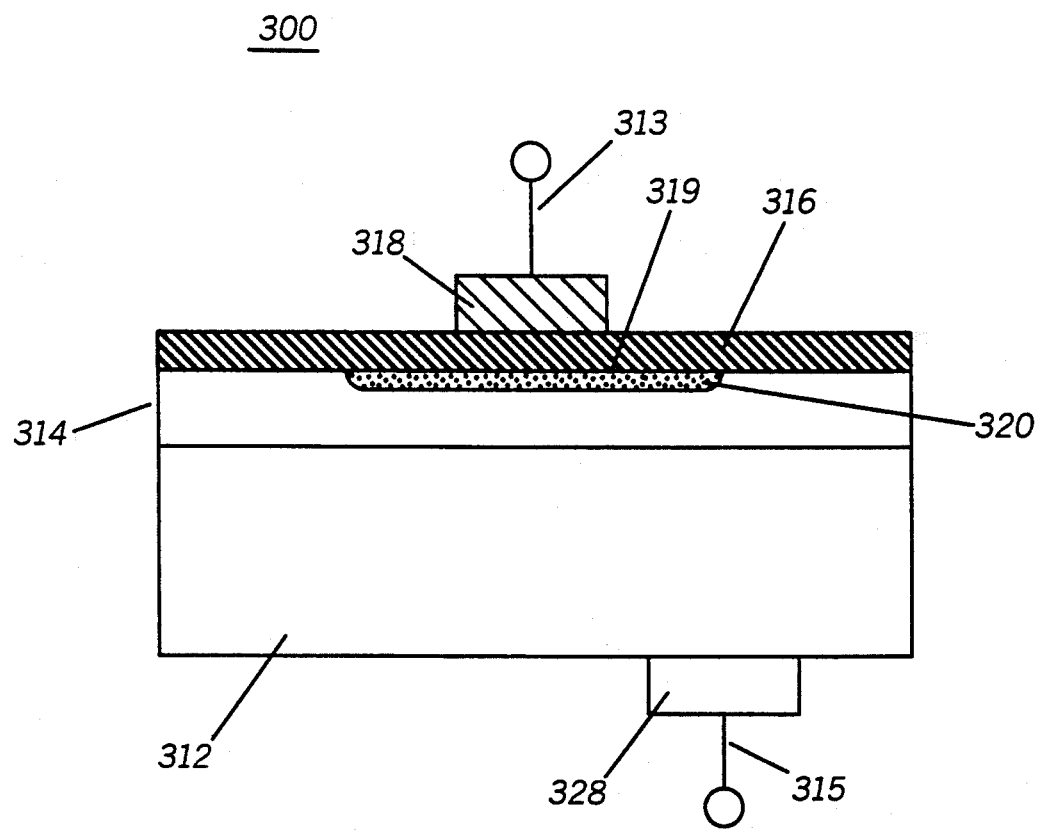
FIG. 3 is a cross sectional view of a voltage variable capacitor for use in accordance with the invention.

Referring to FIG. 1, a block diagram of an integrated electronic switch 100 is shown in accordance with the present invention. The switch 100 includes two input ports 102 and 112, an output port 106, and a control input 108. The switch 100 further comprises a first and a second Voltage Variable Capacitor (VVC) 104 and 110, respectively. The VVCs 104 and 110 are electronically-tunable integrated capacitors. A VVC is a device which exhibits a very large variation in capacitance vs. voltage. FIG. 3 shows one such capacitor in accordance with the present invention. Capacitance variation in the order of 50 to 1 can be exhibited from the ON state to the OFF state with these capacitors. For a given frequency and appropriate circuit topologies this change is equivalent to a short circuit to open circuit transition. Due to the physical construction of the VVC, this electrical property is obtained with no appreciable current drain penalty, the currents present are only leakage currents which are in the order of nano-amperes. The dimension of the VVC is proportional to the capacitance in the OFF state; a typical size for a 50 pico-Farad capacitance is $10 \times 10$ mils.

A VVC can be used as a discrete device or integrated as part of a much larger subcircuit (i.e. antenna switch, etc.). The operation of the VVCs 104 and 110 will be discussed in more detail later. In general, the capacitance of the VVCs 104 and 110 is controlled via a DC voltage applied to their respective inputs, via control input 108. As mentioned, under extreme capacitance changes, and along with appropriate accompanying components, the VVCs 104 and 110 appear as switches having an ON and an OFF state depending on the control voltage. An LC network comprising an inductor 116 and a capacitor 114 is placed in parallel with the VVC 104 to provide a resonance at desired frequencies in order to achieve the transition from the short to the open state for the VVC 104. Similarly, an inductor 120 and a capacitor 118 are used as resonating components for the VVC 110. The outputs of the VVCs 104 and 110 are joined and coupled to the output port 106. A coupling resistor 128, along with a bypass capacitor 130, couple this port 106 to a control line 108 which is used to control the capacitance of VVCs 104 and 110. The input of the VVC 104 is coupled to the first input port 102 via a coupling inductor 122. The input port 102 is coupled to a control switch 138 via a resistor 124. A bypass capacitor 126 is placed across the switch 138 in order to reduce high frequency interferences. The incorporation of these components prevents undesired interference from the high frequency signals on the low frequency capacitance control signals. The switch 138 is grounded in order to provide a return path for the control signal applied to the control line 108. In other words, the switch 138 selects the VVC 104 to be controlled via the control voltage on the control line 108. With the switch 138 in the open position the VVC 104 assumes a high capacitance, hence approaching a short circuit at the desired frequency. This short circuit couples the input port 102 to the output port 106. With the switch 138 in the closed position, the control signal on the control line 108 lowers the capacitance of the VVC 104 allowing it to approach an open circuit, hence disconnecting 102 from 106. The combination of the switch 138 and the control signal on the control line 108 affords selectivity to the coupling between the input port 102 and the output port 106.

Similarly, the input of the VVC 110 is coupled to the second input port 112 via a coupling inductor 132 and the input port 112 is coupled to a switch 140 via a resistor 134. The switch 140 is bypassed to ground via a capacitor 136. The switch 140 is activated when the VVC 110 is to be controlled via the control line 108. As will be explained later in association with FIG. 3, VVCs 104 and 110 require a potential difference at their input and output in order to function as a variable capacitor. Switches 138 and 140 render selectivity to the VVCs 104 and 110, for they share a common control line.

A signal applied to the input port 102 is coupled to the VVC 104. This signal is coupled to the output port 106 when an appropriate voltage is applied to the control line 108 and switches 138 and 140 are placed in the open and closed position, respectively. The control line 108 along with the position of switch 140 prevent the signal from reaching the port 112, hence minimizing interference. Similarly, a signal applied to the input port 112 is coupled to the output port 106 when switches 138 and 140 are closed and open, respectively and an appropriate voltage is applied to the control line 108. Once again minimum interference appears on port 102.

Figure 2:
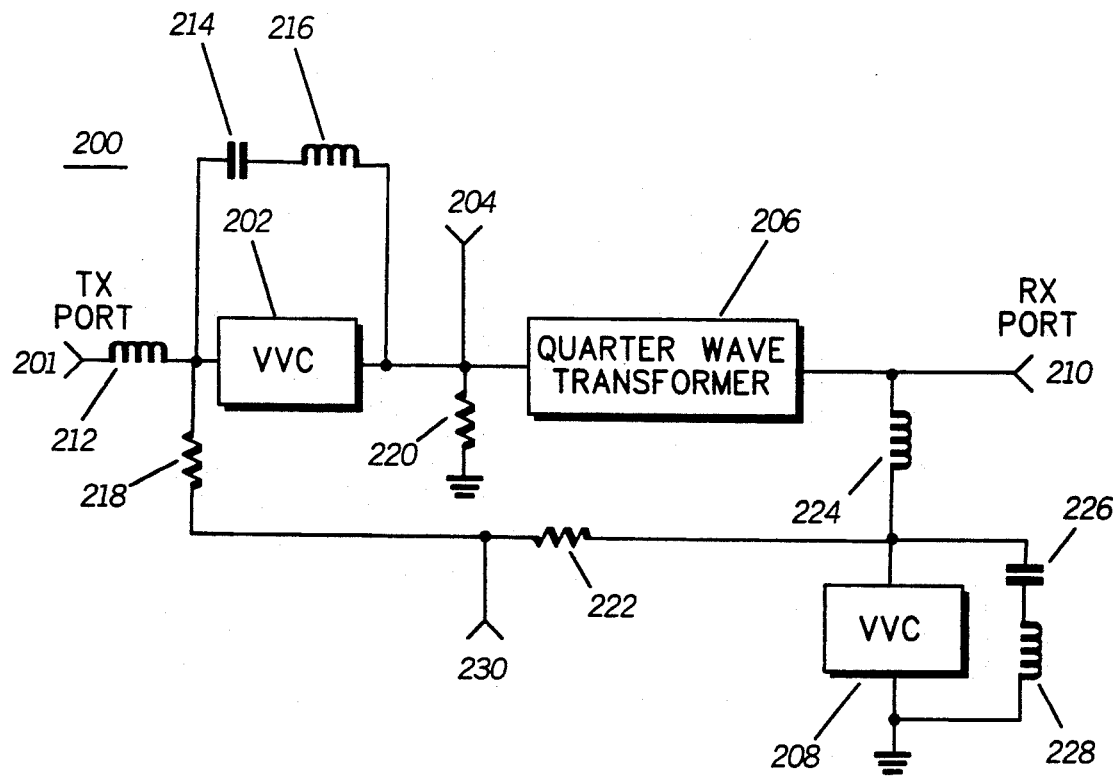
FIG. 2 is an antenna switch in accordance with the present invention.

Referring now to FIG. 2, a block diagram of an antenna switch 200 is shown in accordance with the present invention. The antenna switch 200 includes a receive port 210, a transmit port 201, and an antenna port 204. The transmit port 201 is coupled to the antenna port 204 via a VVC 202 and a coupling inductor 212. The receive port 210 is coupled to the antenna port 204 via a quarterwave transformer 206. A VVC 208 shunts the receive port 210 to ground through an inductor 224. Resonating components consisting of an inductor 216 and a capacitor 214 are placed in parallel with the VVC 202. Similarly, a capacitor 226 and an inductor 228 constitute the resonating components for the VVC 208. The control input for the antenna switch 200 is brought in via control input 230. This control line 230 is coupled to the VVCs 202 and 208 via blocking resistor 218 and 222, respectively. A variety of DC voltages may be used to render different capacitance values to VVCs 202 and 208. In the transmit mode, an appropriate DC voltage is applied to the control line 230. This voltage substantially increases the capacitance of the two VVCs 202 and 208 forcing them into series resonance, and hence short circuit. Consequently, the transmit signal available on the Tx port 201 is coupled to the antenna port 204 where it is transmitted. With the VVC 208 acting as a short circuit the quarterwave transformer functions as an open thereby preventing the transmit signal from reaching the receive port 210.

The operation of quarterwave transformers is well known in the art. In general, the quarterwave transformer 206 may be distributed or lumped. The former uses transmission line technologies while the latter uses components to achieve its desired performance specifications. In the preferred embodiment the quarterwave transformer is of the lumped type for the purpose of integration. Since the two VVCs 202 and 208 are integrated the addition of a transmission line, and hence the quarterwave transformer 206, to the integrated package can be easily accomplished. The result is an integrated antenna switch which may replace the existing switches having non-integratable components.

Figure 6:
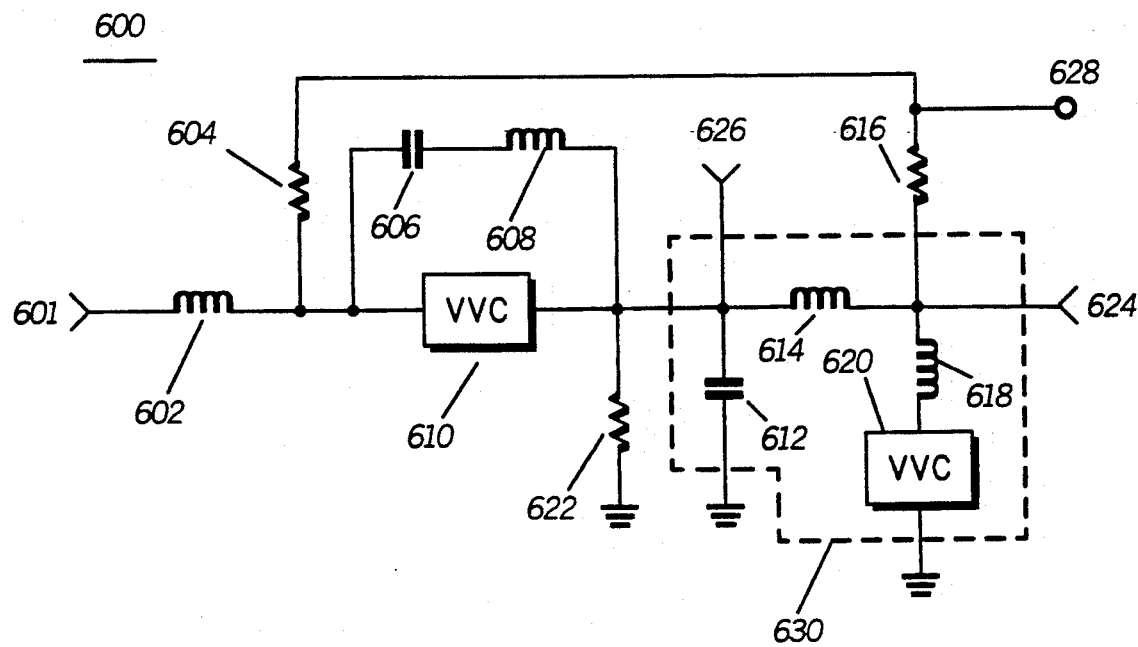
FIG. 6 shows a second alternative embodiment of the present invention.

It can be shown that the VVC 208 and the quarterwave 206 may be combined to form a lumped quarterwave inclusive of the VVC. FIG. 6 shows an alternative embodiment of an antenna switch 600 in accordance with the present invention having the VVC included in the quarterwave topology. The antenna switch 600 includes a transmit port 601, a receive port 624, and an output port 626. The topology used for the transmit side is similar to that used in the antenna switch 200. The transmit port 601 is coupled to the first terminal of a VVC 610 through an inductor 602. The first terminal is coupled to a control line 628 through a resistor 604. The second terminal of the VVC 610 is coupled to ground through a resistor 622. A control voltage applied to the control line 628 proceeds to vary the capacitance of the VVC 610 through the resistor 604. A resonating network comprising an inductor 608 and a capacitor 606 is placed in parallel with the VVC 610 to allow the transition from a short to open as the control signal is varied on the control line 628.

In the receive side, however, a VVC 620 is coupled to the receive port 624 via an inductor 618. The receive port 624 is coupled to the output port via an inductor 614. The output port is shunted to ground via a capacitor 612. The control line 628 is coupled to the VVC 620 via a resistor 616 and the inductor 618. A control signal applied to the control input is used to turn both VVCs 610 and 620 on or off. The combination of the capacitor 612, the inductors 614 and 618, and the VVC 620 forms a quarterwave transformer 630. Along with participating in the topology of the quarterwave operation, the VVC 620 provides the switching action to render the quarterwave transformer 630 open or closed. In the transmit mode, a control signal is applied to the control line 628 to turn both VVCs 610 and 620 to short circuits, hence allowing the transmit signal to be coupled to the antenna port 626. With the VVC 620 shorting the inductor 618 to ground, the receive port is isolated from the antenna port 626 and hence minimum transmit signal is passed through. In receive mode, however, the two VVCs 610 and 620 are turned into open circuits allowing a received signal at the antenna port 626 to be coupled to the receive port 624 with minimum interference on the transmit port 601.

Referring now to FIG. 3, there is shown a cross-sectional view of a VVC 300 in accordance with the present invention. The construction of the VVC 300 is presented here as a model for those used in the switches 100, 200, 500, and 600. The VVC 300 has two control lines, 313 and 315. An appropriate voltage applied to these control lines 313 and 315 is used to tune the VVC 300. The polarity of this voltage depends on the material used to construct the VVC 300. The VVC 300 is formed on a semiconductor substrate 312 having a surface layer 314 being less heavily doped than the substrate 312. The surface layer 314, being less heavily doped, has a higher resistivity than the semiconductor and serves as an area for a depletion layer to form. An insulator layer 316 is applied over the surface layer 314. At least one metal plate 318 is formed on the insulator layer 316. The metal plate 318 provides the external contact to the reactance component of the VVC 300 via a contact pin 313. More metal plates along with contacts may be formed on the insulator layer 316 to provide further control over the distributed capacitance of the VVC 300.

The polarity of the semiconductive material used in the fabrication of layers 312 and 314 determines the voltage polarities that will have to be applied to the control lines of the VVC. In other words, the polarity of the voltage potential applied to the control lines of devices 100, 200, 500, and 600 depends on the polarity of the semiconductive material used for layers 312 and 314.

The insulator layer 316 is preferably Zirconium Titanate (ZrTiO$_4$) applied in a thickness from 300 Ångstroms to 1000 Ångstroms, but thicknesses from 100 Ångstroms to 2 microns have been found to be suitable. The material employed as the dielectric or insulating layer should have a dielectric constant much greater than that of the semiconductor. Examples of suitable materials that may be used for this purpose are to be found in TABLE 1 below:

TABLE 1

| | |
|---|---|
| tantalum pentoxide | Ta$_2$O$_5$ |
| niobium pentoxide | Nb$_2$O$_5$ |
| zirconium oxide | ZrO$_2$ |
| titanium dioxide | TiO$_2$ |
| zirconium titanate | ZrTiO$_4$ |
| strontium titanate | SrTiO$_3$ |
| barium titanate | BaTiO$_3$ |
| lead titanate | PbTiO$_3$ |
| barium tetratitanate | Ba$_2$Ti$_9$O$_{20}$ |
| barium neodymium titanate | BaNd$_2$Ti$_5$O$_{14}$ |
| lead-zirconium titanate | Pb(Zr,Ti)O$_3$ |
| lead-lanthanum zirconium titanate | (Pb,La)(Zr,Ti)O$_3$ |
| lithium niobate | LiNbO$_3$ |
| strontium-baruim niobate | (Sr,Ba)Nb$_2$O$_6$ |

Oxides of additional elements such as molybdenum, tungsten and vanadium may also be expected to be useful, either alone or in combination with other elements.

When an appropriate reverse bias is applied between the metal electrodes 318 and 328, mobile minority charge carriers are attracted to a semiconductor insulator interface 319, forming a space-charge or depletion layer 320, which extends for some distance into the semiconductor 314. This depletion layer 320 behaves as a variable width capacitor which is electrically in series with the capacitor formed by the insulator layer 316. These two series capacitors serve to create a net capacitance effect that is affected by the changes of each individual capacitor. The electrode bias voltage controls the width of the depletion layer 320 from zero at the accumulation threshold to a maximum thickness at the inversion threshold and thereby varies the total capacitance of the device. The insulator layer 316 serves to provide the spacing between the top electrode 318 and the depletion layer 320. The depletion layer 320 is a transient layer formed when the bias voltage is applied to the capacitor through input contacts 313 and 315. The depletion layer 320, hence the distributed capacitance, may be reduced or disappear when the applied voltage field is varied or removed. Although shown in the drawing as a distinct feature, the depletion layer 320 should not be regarded as a permanent mechanical feature of the VVC 300. The operation theory described herein is similar to that found in operation of metal-oxide-semiconductor capacitors.

At the inversion threshold voltage, enough charge carriers have been attracted to the semiconductor interface such that an inversion layer is formed. Increasing the voltage bias increases the width of the inversion layer, until the layer reaches a maximum width, beyond which the depletion layer cannot be substantially increased by increasing electrode bias voltage. The maximum depletion width is determined by the concentration of the impurity dopant near the semiconductor surface onto which the insulator layer 316 has been deposited. Dopants such as phosphorous, antimony, boron and arsenic will be recognized by those skilled in the art to be useful with silicon substrates. Other semiconductor substrates, such as gallium arsenide may also be utilized to form a VVC in accordance with the invention.

The lower the doping, the larger the maximum depletion layer thickness, and thus, the lower minimum capacitance which can be achieved. The thickness of a less heavily doped surface layer may be chosen to be equal to or slightly greater than this maximum depletion width in order to minimize the series resistance of the device while maximizing the capacitance change.

Formation of an improved voltage tunable switching network is highly dependent upon the choice of the material comprising the insulator layer 316. By choosing a material with a much larger relative dielectric constant than the semiconductor depletion layer 320, a larger ratio of maximum-to-minimum distributed capacitance will be obtained. The larger the insulator's dielectric constant, the larger the capacitance ratio in capacitance per unit area will be for a given insulator thickness.

Many materials with very high dielectric constants have ferroelectric properties which are not desirable for high frequency devices. The polarization for a ferroelectric material has a hysteresis loop, or memory, whereby a residual polarization remains after an applied bias voltage has been removed. Thus, a residual depletion layer would also remain and thereby limit the capacitance ratio which may be obtained. These materials would be best utilized in lower frequency applications.

A low-loss, non-ferroelectric insulator layer is required for high frequency applications, specifically those for use in radio transmitting and receiving, and especially for tunable high-Q filters. Zirconium Titanate (ZrTiO$_4$) is one suitable non-ferroelectric material with a high relative dielectric constant (K$_r$ is approximately equal to 40) and low dielectric loss. By comparison, the relative dielectric constant of silicon dioxide (used in conventional MOS capacitors) is 3.9. The dielectric constant of the depletion layer in silicon 11.7 and the dielectric constant of the depletion layer in germanium is 15.7. It can be easily seen that the dielectric constant of the zirconium titanate and the aforementioned materials in Table 1 is much larger than that of silicon dioxide. Therefore, an improved capacitor having higher capacitance ratio can be fabricated. Thin films of zirconium titanate can be formed by any of several techniques, including but not necessarily limited to, sputtering, evaporation, chemical vapor deposition, ion beam or plasma enhanced processes, sol-gel, and other solution chemistry processes. The presentation of this view is meant only to enhance the understanding of the layers involved in the construction of the VVC 300. It is not in any fashion meant to imply, directly or otherwise, a limitation on the present invention.

Figure 5:
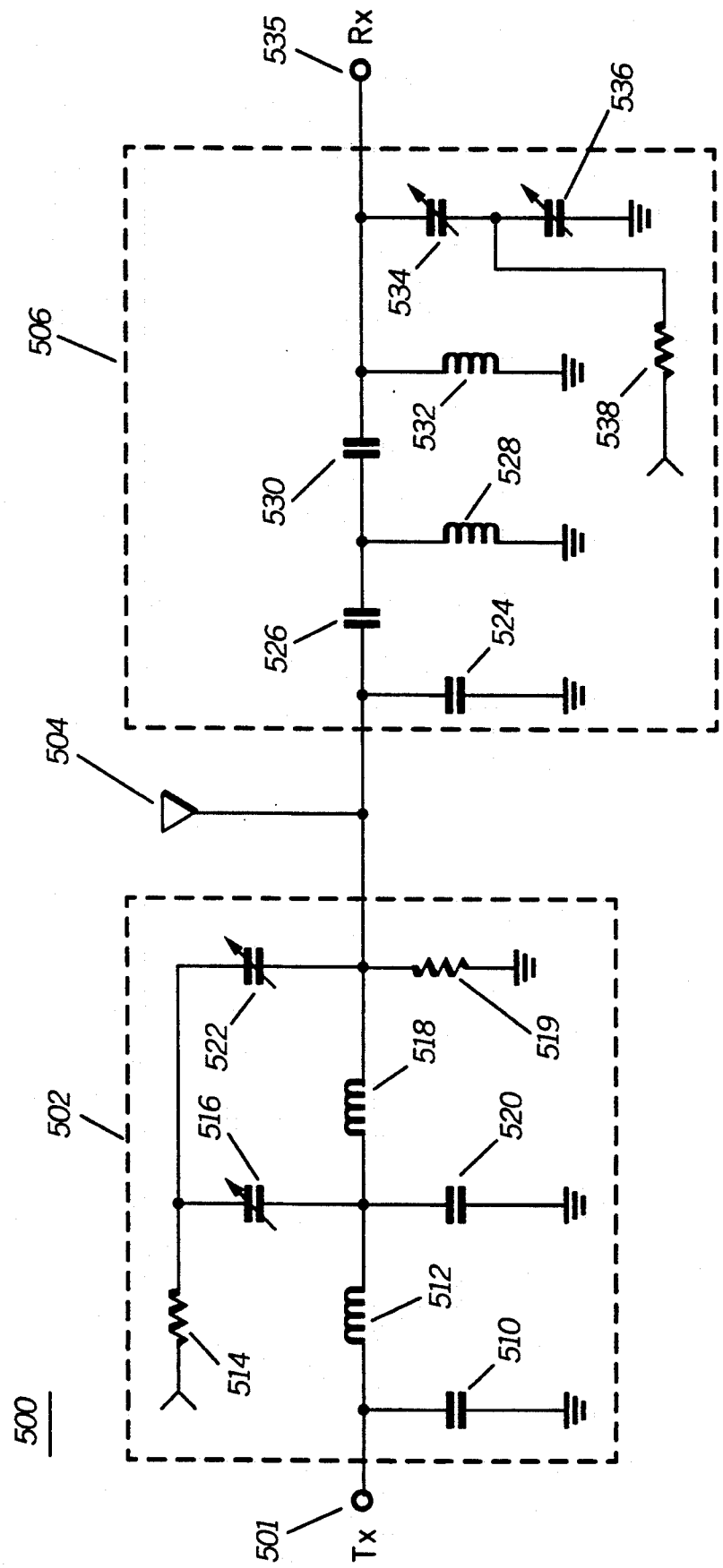
FIG. 5 shows a first alternative embodiment of the present invention.

Referring to FIG. 5, a second alternative embodiment of an antenna switch in accordance with the present invention is shown. The antenna switch 500 includes a transmit port 501, a receive port 535 and an antenna port 504. The antenna switch 500 incorporates the VVC of the present invention with filter topologies to result in transmit and receive filters combined with antenna switch functions. The transmitter port 501 is coupled to the antenna port 504 via a Low Pass Filter (LPF) 502. Similarly, the receive port 535 is coupled to the antenna port 504 via a bandpass filter 506. The latter is a filter having several reactive components, specifically capacitors 510, 520 and inductors 512 and 518 in conjunction with the VVC's 516 and 522. The filter 502 is designed to have lowpass characteristic along with providing switching function for the coupling of the transmitter port 501 to the antenna port 504. A resistor 514 is used to couple a control signal to the VVC's 516 and 522. In addition, a resistor 519 couples the capacitor 522 and 516 (through inductor 518) to ground. The resistor 519 provides a DC ground for the control signal. The values of the resistors may be so chosen to reflect a high impedance at the operating frequencies. A radio frequency signal available at the transmitter port 501 is filtered by the filter 502 and coupled to the antenna port 504. On the receive side, a bandpass filter is formed via capacitors 524, 526, and 530 and inductors 528 and 532. Two VVC's 534 and 536 are used to provide the filter 506 with switching functions and tunability. Once again, a resistor 538 is used to couple a control signal to the VVC's 534 and 536. A signal available at the antenna port 504 is filtered via the filter 506 and coupled to the receive port 535. The signal will be blocked at the transmitter port via the filter 502 so as to prevent interference. Similarly, signals on the transmitter port are blocked by the filter 506 in order to minimize interference at the receive port by transmitting signals.

In the alternative embodiment, a VVC has been implemented within the filter structures that provide transmitter isolation during receive function and receive isolation during transmit function. With this scheme, significant current reductions are realized as compared to implementations using series pin diodes between the lowpass filter and the antenna port in the transmit back end and between the bandpass filter and the antenna port in the receiver front end. Along with providing blocking functions, the VVC 516 and 522 in the transmit filter and 534 and 536 in the receive filter can provide tunability in the receiver and in the transmitter frequency band. This could be a method of achieving a multi-bandpass filter along with an antenna switching function. It is well understood that minor modifications may be implemented in the preferred or alternative embodiments without departing significantly from the spirit of the present invention. The presentation of the antenna switches 500, 600, and 200 are meant to provide embodiments of the present invention and not to introduce topological limitations thereof.

Figure 4:
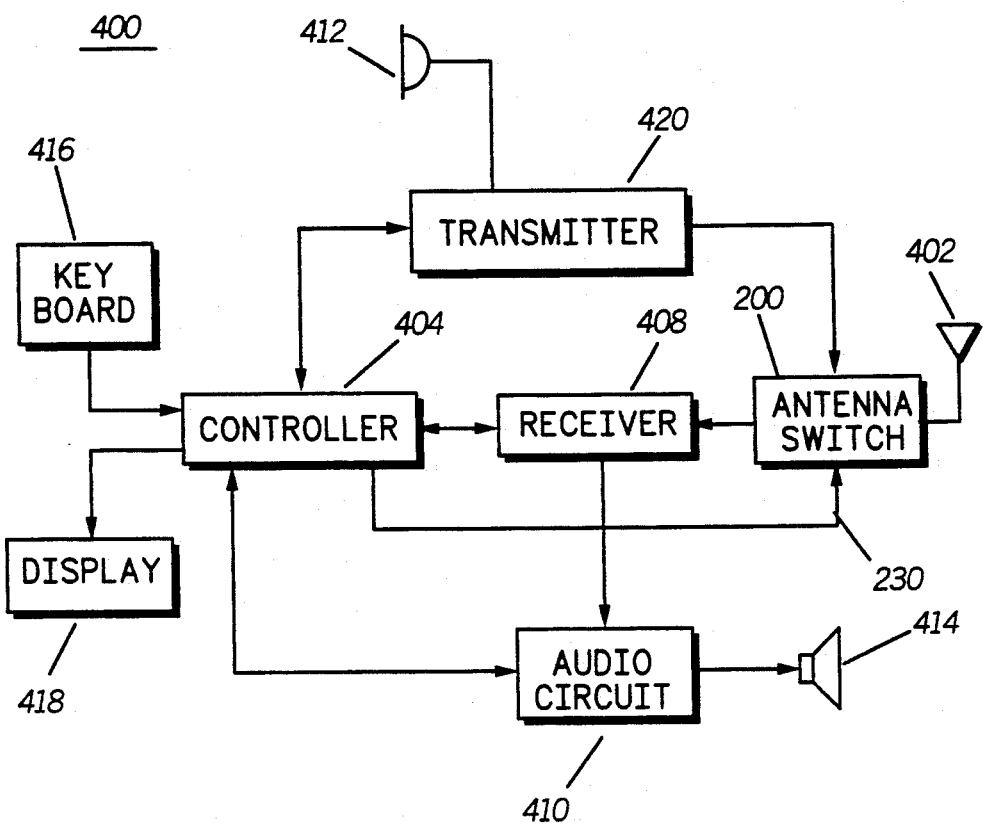
FIG. 4 is a block diagram of a communication device in accordance with the present invention.

Referring to FIG. 4 now, a block diagram of the electrical components of a communication device 400 is shown in accordance with the present invention. The communication device 400 includes an antenna 402, receiver 408, and a transmitter 420, the receiver 408 and the transmitter 420 are coupled to the antenna 402 via the antenna switch 200. The antenna switch 200 couples the antenna 402 to the transmitter 420 or the receiver 408 under the direction of a controller 404. A radio frequency signal available at the antenna 402 is coupled to the input of the receiver 408 via the antenna switch 200. The received radio frequency signal is recovered by the receiver 408 and coupled to the controller 404 for appropriate presentation. Data messages are decoded by the controller 404 and stored or displayed on a display 418. Voice messages are coupled to the speaker 414 via the audio circuit block 410. The audio circuit block 410 contains audio gating circuits which control the gating of audio to the speaker 414. The gating of the audio circuits is controlled by the controller 404.

In the transmit mode, audio signals transduced via a microphone 412 and data signals entered via a keyboard 416 are coupled to the transmitter 420. The transmitter 420 processes these signals and prepares them for transmission via the antenna 402 through the antenna switch 200. Once again the control line 230 is activated by the controller 404 in order to couple the transmitter 420 to the antenna 402.

The ability to control the frequency of operation of the antenna switch 200 renders the integration of all the elements of the communication device 400 on an integrated circuit more feasible. The predicament in fabricating a single chip receiver can now be removed by eliminating the need for discrete components that were not realizable in semiconductor devices. With the network 100 fully integratable it is now possible to electronically control the operation of many electronic circuits previously not possible. A significant benefit of this is the elimination of the need to proliferate receiver assemblies to cover a desired operating range.

A significant benefit of integrating an antenna switch is its matching of component parameters. It is well known that an integrated circuit will have similar component tolerance variation across a given circuit for the same type of components. For example, if the fabrication process yields a capacitance per square of electrode that is low, all of the capacitors will be low by a similar percentage. This would result in a control voltage tracking across a circuit.

Another benefit of integrating an antenna switch along with its reactance components is that the reactance component (VVC) can be compensated for temperature, humidity, or other environmental conditions. Additional sensors can be implemented with the VVC that have the same processing variations as the VVC, rendering them significantly more accurate. This can be used to overcome the processing and environmental circuit performance variations to maintain a stable circuit performance.

Accordingly, the use of VVC in an antenna switch eliminates the need for pin diodes and their associated high current drain. The result is a switch which is fully integratable and electronically controllable. Ultra low leakage and consumption currents added to appreciable size and cost reductions along with improved large signal characteristics render this switch suitable for applications not possible with available technologies. Furthermore, it is noted that since the VVCs of the present invention do not comprise PN junction the non-linearities which are common with such junctions are less prevalent.

What is claimed is:

1. An integrated electronic switch having a first and a second port and a control input, the switch comprising:
    a first electronically-tunable integrated capacitor having a first control means for selectively coupling the first input port to the output port; and
    a second electronically-tunable integrated capacitor having a second control means for selectively coupling the second input port to the output port.

2. The integrated electronic switch of claim 1, wherein the first electronically-tunable integrated capacitor includes:

a semiconductor having a first and a second layer, the second layer formed of semiconductive material of a higher resistivity than the first layer;

a depletion layer formed in the high resistivity layer;

an insulating layer formed on the high resistivity layer, said insulating layer being a metal oxide having a dielectric constant greater than the dielectric constant of the semiconductor; and a conductive electrode formed on the insulating layer.

3. The integrated electronic switch of claim 2, wherein the insulating layer has a dielectric constant greater than 16.

4. The integrated electronic switch of claim 2, wherein the insulating layer is a low-loss, non-ferroelectric insulator.

5. The integrated electronic switch of claim 2, wherein the dielectric constant of the insulating layer is greater than the dielectric constant of the second layer of semiconductive material.

6. The integrated electronic switch of claim 2, wherein the insulating layer material is a metal oxide wherein the metal comprises at least first and second components selected from the group consisting of barium, lead, lithium, molybdenum, neodymium, niobium, strontium, tantalum, titanium, tungsten, vanadium, and zirconium.

7. The integrated electronic switch of claim 1, wherein the first electronically-tunable integrated capacitor comprises a Zirconium Titanate integrated capacitor.

8. The integrated electronic switch of claim 1, wherein the first electronically-tunable integrated capacitor includes:

a semiconductor having a first and a second layer, the second layer formed of semiconductive material of a higher resistivity than the first layer;

a depletion layer formed in the high resistivity layer;

an insulating layer formed on the high resistivity layer, said insulating layer being a metal oxide having a dielectric constant greater than the dielectric constant of the semiconductor; and a conductive electrode formed on the insulating layer.

9. The integrated antenna switch of claim 8, wherein the insulating layer is a low-loss, non-ferroelectric insulator.

10. An integrated antenna switch having a receive port, a transmit port and an antenna port, the antenna switch comprising:

a first electronically-tunable integrated capacitor coupling the transmit port to the antenna port, the first capacitor having a control means for selectively de-coupling the transmit port from the antenna port;

a second electronically-tunable integrated capacitor coupled to the receive port; and coupler means for coupling the receive port to the antenna port.

11. The integrated antenna switch of claim 10, wherein the coupler means includes a quarterwave transformer.

12. The integrated antenna switch of claim 10, wherein the second electronically tunable integrated capacitor is included in the coupler means.

13. The integrated antenna switch of claim 10, wherein the first electronically-tunable integrated capacitor comprises a Zirconium Titanate integrated capacitor.

14. A communication device, comprising:

an integrated antenna switch having a receive port, a transmit port, and an antenna port, the antenna switch comprising:

(a) a first electronically-tunable integrated capacitor for coupling the transmit port to the antenna port;

(b) a second electronically-tunable integrated capacitor coupled to the receive port;

(c) coupler means for coupling the receive port to the antenna port; and receiver means coupled to the integrated antenna switch for receiving radio communication signals.

15. The communication device of claim 14, wherein the coupler means includes a quarterwave transformer.

16. The communication device of claim 14, wherein the first electronically-tunable integrated capacitor comprises a Zirconium Titanate integrated capacitor.

17. The communication device of claim 14, wherein the first electronically-tunable integrated capacitor includes:

a semiconductor having a first and a second layer, the second layer formed of semiconductive material of a higher resistivity than the first layer;

a depletion layer formed in the high resistivity layer;

an insulating layer formed on the high resistivity layer, said insulating layer being a metal oxide having a dielectric constant greater than the dielectric constant of the semiconductor; and a conductive electrode formed on the insulating layer.

18. The communication device of claim 17, wherein the dielectric constant of the insulating layer is greater than the dielectric constant of the high resistivity semiconductor material.

19. An integrated antenna switch having a receive port, a transmit port and an antenna port, the antenna switch comprising:

a first electronically-tunable integrated capacitor coupled to the transmit port, the first capacitor having a control input for selectively de-coupling it from the transmit port;

a second electronically-tunable integrated capacitor coupled to the receive port; and coupler means for coupling the receive and the transmit ports to the antenna port.

20. The integrated antenna switch of claim 19, wherein the coupler means includes a quarterwave transformer.

21. The antenna switch/filter assembly of claim 20, wherein the second filter includes an electronically tunable capacitor for substantially decoupling the transmit port from the antenna port.

22. An antenna switch/filter assembly having an antenna port, a receive port, and a transmit port, comprising:

a first filter coupled between the receive port and the antenna port, the first filter including an electronically tunable capacitor for substantially decoupling the receive port from the antenna port; and a second filter coupled between the transmit port and the antenna port.

* * * * *